(12) United States Patent
Fan et al.

(10) Patent No.: US 10,980,110 B2
(45) Date of Patent: Apr. 13, 2021

(54) SHADOW ELIMINATION DETECTION METHOD AND MANUFACTURING METHOD FOR A TOUCH SUBSTRATE, TOUCH SUBSTRATE AND TOUCH DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Wenjin Fan, Beijing (CN); Lei Zhang, Beijing (CN); Tsung Chieh Kuo, Beijing (CN); Yang Liu, Beijing (CN); Kui Lv, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 600 days.

(21) Appl. No.: 15/756,474

(22) PCT Filed: Jul. 20, 2017

(86) PCT No.: PCT/CN2017/093647
§ 371 (c)(1),
(2) Date: Feb. 28, 2018

(87) PCT Pub. No.: WO2018/059090
PCT Pub. Date: Apr. 5, 2018

(65) Prior Publication Data
US 2019/0025982 A1 Jan. 24, 2019
US 2020/0192519 A9 Jun. 18, 2020

(30) Foreign Application Priority Data
Sep. 30, 2016 (CN) .......................... 201610868054.9

(51) Int. Cl.
*G06F 3/041* (2006.01)
*H05K 1/02* (2006.01)
*G02F 1/1335* (2006.01)

(52) U.S. Cl.
CPC ..... *H05K 1/0269* (2013.01); *G02F 1/133512* (2013.01); *G06F 3/041* (2013.01); *G06F 2203/04103* (2013.01)

(58) Field of Classification Search
CPC .................. G06F 3/041; G06F 3/0418; G06F 2203/04103; H05K 1/0269; G02F 1/133512
See application file for complete search history.

(56) References Cited

U.S. PATENT DOCUMENTS

2013/0278635 A1* 10/2013 Maggiore ............. G06F 3/0304
345/633
2014/0132858 A1* 5/2014 Iwata ...................... G06F 3/041
349/12

(Continued)

FOREIGN PATENT DOCUMENTS

CN 101699332 A 4/2010
CN 103823586 A 5/2014

(Continued)

OTHER PUBLICATIONS

English Translation of PCT International Search Report, Application No. PCT/CN2017/093647, dated Oct. 18, 2017, 3 pages.

(Continued)

*Primary Examiner* — Syed Haider
(74) *Attorney, Agent, or Firm* — Armstrong Teasdale LLP (57) ABSTRACT

The present disclosure provides a shadow elimination detection method for a touch substrate, a touch substrate manufacturing method, a touch substrate, and a touch device. The shadow elimination detection method for a touch substrate includes detecting a difference in light reflectance between (Continued)

```
                                    201
┌─────────────────────────────────────────────────┐
│ A difference in light reflectance between test  │
│ blocks with different structures located in an  │
│ area outside a touch area of the touch substrate│
│                  is detected                    │
└─────────────────────────────────────────────────┘
                         │
                         ▼
                                    202
┌─────────────────────────────────────────────────┐
│ A shadow elimination effect of the touch        │
│ substrate is determined according to the        │
│ difference, wherein each of the test blocks with│
│ different structures includes a structure       │
│ corresponding to a respective structure in      │
│ different structures in the touch area          │
└─────────────────────────────────────────────────┘
``` test blocks with different structures located in an area outside a touch area of the touch substrate using a detection device, and determining a shadow elimination effect of the touch substrate according to the difference, wherein each of the test blocks with different structures includes a structure corresponding to a respective structure in different structures in the touch area.

17 Claims, 5 Drawing Sheets

(56) References Cited

U.S. PATENT DOCUMENTS

| | | | |
|---|---|---|---|
| 2015/0062457 A1* | 3/2015 | Kida | G06F 3/0412 349/12 |
| 2015/0160778 A1 | 6/2015 | Kim et al. | |
| 2017/0168330 A1* | 6/2017 | Wang | G09G 3/3208 |

FOREIGN PATENT DOCUMENTS

| | | | | |
|---|---|---|---|---|
| CN | 104992960 A | * | 10/2015 | ....... G02F 1/133345 |
| CN | 104992960 A | | 10/2015 | |
| CN | 205302251 U | | 6/2016 | |
| CN | 106168868 A | | 11/2016 | |
| CN | 206301316 U | | 7/2017 | |

OTHER PUBLICATIONS

PCT Written Opinion, Application No. PCT/CN2017/093647, dated Oct. 18, 2017, 7 pages.: with English translation of relevant part.

* cited by examiner

SHADOW ELIMINATION DETECTION METHOD AND MANUFACTURING METHOD FOR A TOUCH SUBSTRATE, TOUCH SUBSTRATE AND TOUCH DEVICE

CROSS REFERENCE TO RELATED APPLICATIONS

This patent application is a National Stage Entry of PCT/CN2017/093647 filed on Jul. 20, 2017, which claims the benefit and priority of Chinese Patent Application No. 201610868054.9 filed on Sep. 30, 2016, the disclosures of which are incorporated herein by reference in their entirety as part of the present application.

BACKGROUND

Embodiments of the present disclosure relate to the field of touch control technology, and in particular, to a shadow elimination detection method for a touch substrate, a touch substrate manufacturing method, a touch substrate, and a touch device.

At present, the capacitive touch screen has become a very popular electronic product, and OGS (One Glass Solution) has become a mainstream technical solution thereof. OGS refers to the technology of directly forming an indium tin oxide (ITO) conductive film and sensors on a protective glass of a touch screen. There are channel patterns formed by ITO in the visible area of the OGS touch screen. The visibility of the ITO channel patterns (referred to as the shadow elimination level in technical terms) is related to the user experience. Therefore, in the manufacturing process of the touch screen, its shadow level needs to be tested.

BRIEF DESCRIPTION

One aspect of the present disclosure provides a touch panel shadow elimination detection method which includes detecting a difference in light reflectance between test blocks with different structures located in an area outside a touch control area of a touch substrate using a detection device, and determining a shadow elimination effect of the touch substrate according to the difference, wherein each of the test blocks with different structures includes a structure corresponding to a respective structure in different structures in the touch area.

Another aspect of the present disclosure provides a method for manufacturing a touch substrate which includes forming test blocks with different structures in an area outside a touch area of a touch substrate in a manufacturing process of the touch substrate, wherein each of the test blocks with different structures includes a structure corresponding to a respective structure in different structures in the touch area.

Still another aspect of the present disclosure provides a touch substrate including test blocks with different structures located in an area outside a touch area thereof, wherein each of the test blocks with different structures includes a structure corresponding to a respective structure in different structures in the touch area.

Still another aspect of the present disclosure provides a touch device which includes the touch substrate according to any embodiment of the present disclosure.

DETAILED DESCRIPTION

In order to make those skilled in the art better understand the solution of the present disclosure, a touch panel shadow elimination detection method, a touch substrate manufacturing method, a touch substrate, and a touch device provided by embodiments of the present disclosure are described in detail below with reference to the accompanying drawings. It is apparent that the described and illustrated embodiments and various specific features thereof are merely illustrative of the disclosure, rather than limitation to the disclosure. All other embodiments and specific features thereof, which are obtained by those of ordinary skill in the art based on the exemplary description without the need of any creative efforts, should fall within the protection scope of the present disclosure.

In the related art, the method for detecting the shadow level of the OGS touch screen is as follows: when the manufacturing process reaches the point where small panels are produced, visual inspection is adopted to determine the shadow level. There are two disadvantages of this detection method: 1) It is impossible to intercept and improve products with defective shadowing in the process in time, resulting in unnecessary loss of production, and 2) The visual inspection and determination has a large error, and cannot accurately determine the shadow level. Other touch screen technologies such as On-cell also have similar problems.

Figure 1:
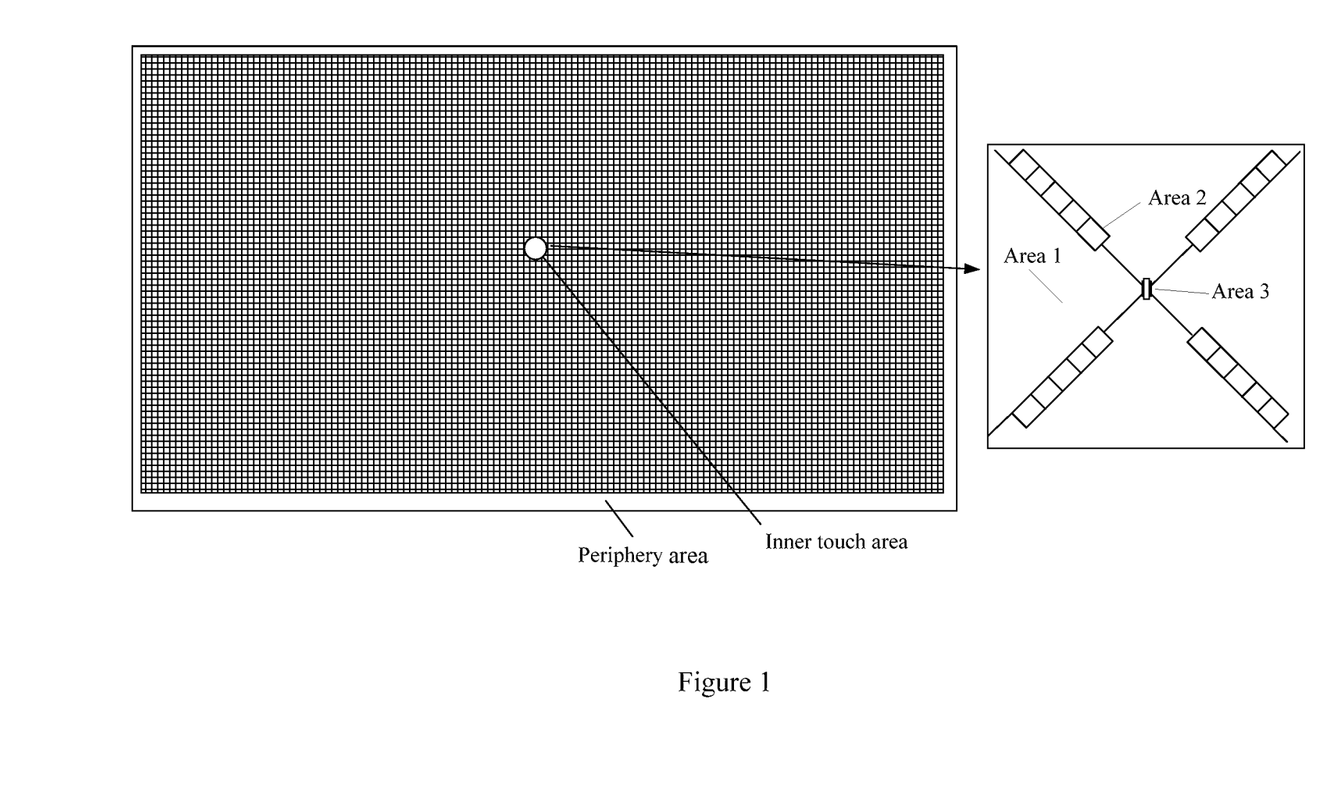
FIG. 1 shows the internal touch area of a single OGS touch substrate.

Referring to FIG. 1, an internal touch-sensitive area of a single OGS touch substrate is shown. As shown in FIG. 1, the inner touch-sensitive area includes the following three different laminated structure areas: a first area 1, a second area 2, and a third area 3. Therein, the first area 1 may include an ITO conductive block made of a conductive ITO material, which serves as a touch electrode, the second area 2 may include an ITO etching line that separates adjacent ITO conductive blocks, the third area 3 is a bridge point area that connects opposing two ITO conductive blocks through a bridge structure of a metal or ITO material. There is a difference in light reflectance between the first area 1, the second area 2, and the third area 3, and if the difference in light reflectance between the three areas is large, the level of shadow elimination is poor. Since the ITO etched line is very narrow, usually only 30-300 μm, and ITO bridge point is generally only 100 μm, it is very difficult to estimate the level of shadow elimination by an optical detecting device, which at present is mostly judged by human eyes.

Figure 2:
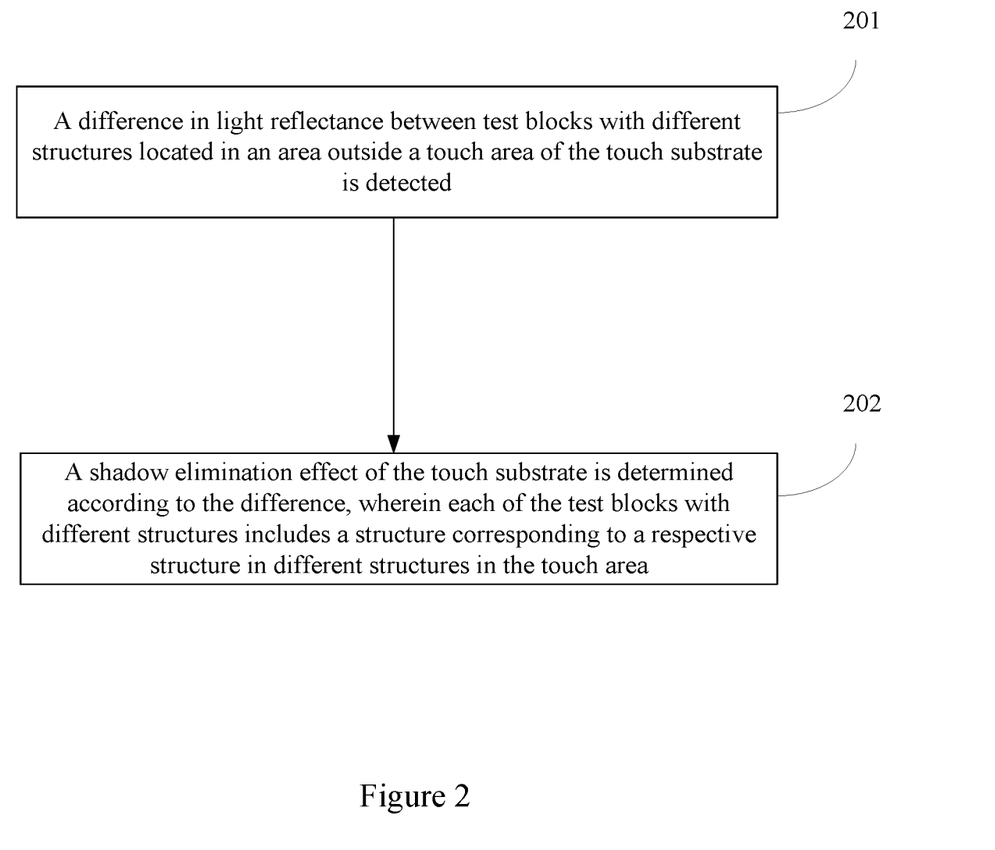
FIG. 2 shows a shadow elimination detection method for a touch substrate according to an embodiment of the present disclosure.

Referring to FIG. 2, a touch panel shadow illumination detection method according to an embodiment of the present disclosure is illustrated. As shown in FIG. 2, the method includes the following steps:

In step 201, a difference in light reflectance between test blocks with different structures located in an area outside a touch area of the touch substrate is detected; and In step 202, a shadow elimination effect of the touch substrate is determined according to the difference, wherein each of the test blocks with different structures includes a structure corresponding to a respective structure in different structures in the touch area.

That is, in the manufacturing process of the touch substrate, at least two test blocks dedicated for optic inspection are formed in an area outside the touch area of the touch substrate, and the at least two test blocks respectively have laminated structures corresponding to the respective laminated structure areas (here, the corresponding laminated structure refers to the laminated structures of the test blocks having the same or partially the same laminated structures as the laminated structure areas, which may also be referred to as the same or similar laminated structures), so as to have the same or similar light reflectances as the corresponding laminated structure areas respectively, and have a size suitable for optic inspection.

Based on the above, it can be seen that the difference in light reflectance between the different laminated structure areas in the touch area of the touch substrate may be estimated by using a detection device, such as an optic inspection device, to detect the difference in light reflectance between the at least two test blocks, thus overcoming the disadvantage that the size of a single laminated structure in the touch area of the touch substrate is too small to be suitable for directly detecting the difference in light reflectance by the optic inspection device, so that the level of the shadow elimination can be accurately determined. In addition, since each of the at least two test blocks has the same or similar laminated structure as the corresponding laminated structure area, during the manufacture of the touch substrate, the at least two test blocks may be formed simultaneously with the formation of the laminated structure areas (e.g., by simply adding mask patterns for forming the at least two test blocks), so that the at least two test blocks can be conveniently and cost-effectively formed, and the level of shadow elimination of the product can be determined in a timely manner during the manufacturing process.

In the above description, the detection device may be any detection device having a light reflectance detection function. For example, it may be any optic inspection device having a light reflectance detection function, such as a photometer, for example, it may be any sensor having a light reflectance detection function, such as a light sensitive sensor, for example, it may be any digital image processing apparatus having a light reflectance detection function, such as a machine vision system.

In some embodiments, the touch substrate may be an OGS panel. In other embodiments, the touch substrate may also be other types of touch substrates, such as an On-cell touch substrate etc.

Figure 3:
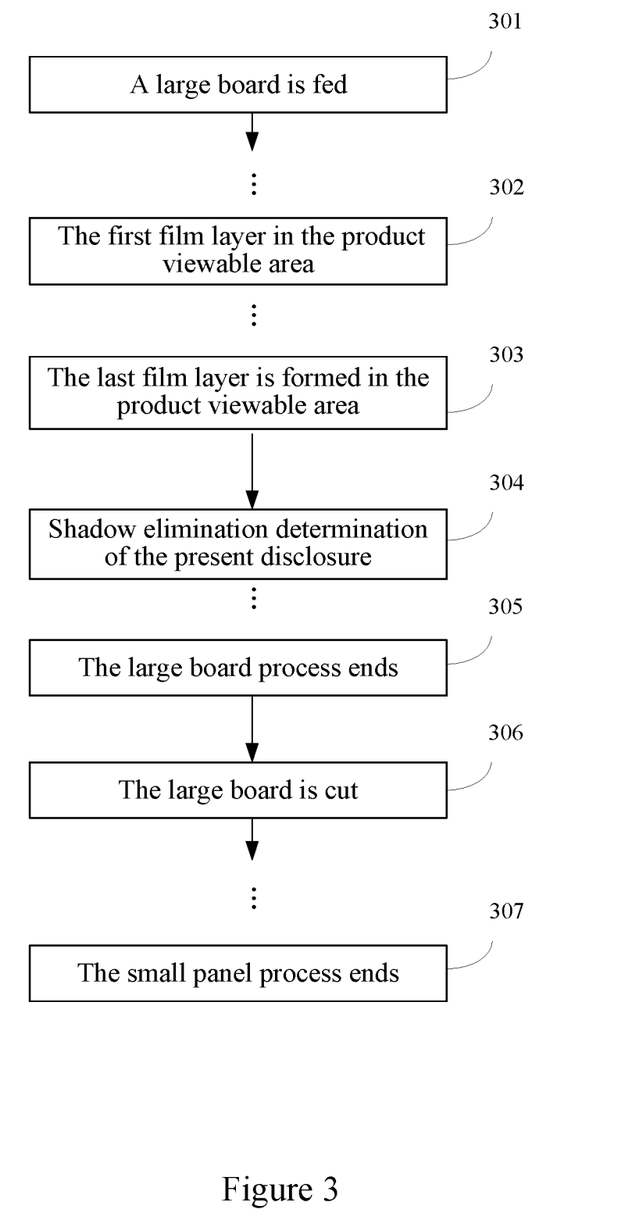
FIG. 3 schematically shows a manufacturing process of a touch substrate.

FIG. 3 schematically shows a manufacturing process of the touch substrate. As shown in FIG. 3, the manufacturing process includes the following steps:

In step 301, a large board is fed, thereafter, the relevant process steps may be performed on the large board.

In step 302, the first film layer is formed in the product viewable area, thereafter, other film layers may be sequentially formed in the product viewable area.

In step 303, the last film layer is formed in the product viewable area.

In step 304, after the last film layer is formed in the product viewable area, the shadow elimination determination of the present disclosure is performed, thereafter, the relevant process steps known in the art may be performed on the large board having the film layers formed.

In step 305, the large board process ends.

In step 306, the large board is cut, thereafter, the relevant process steps known in the art may be performed on cell panels formed by the cutting.

In step 307, the small panel process ends.

In other words, the manufacturing process of the touch substrate can be divided into two stages, which are respectively referred to as a large board process and a small panel process. In the large board process, a plurality of film layers and their structures are sequentially formed on a large bare glass with a suitable size, for example, a black matrix (BM) layer, an ITO layer, an insulating layer, bridge points, a protective layer etc. are sequentially formed, thus forming the above first area 1, second area 2, and third area 3.

As known to those skilled in the art, the formation of each layer and the structures therein generally includes the steps of coating a substrate with a film, coating a photoresist, exposing using a mask pattern, developing with a developer, etching with an etchant, removing the remaining photoresist using a photoresist stripper, etc.

In the small panel process, the large board is cut into small panels (which may be referred to as cell panels), which are then edged, and bound to form a monolithic touch substrate.

The touch panel shadow elimination detection method of the present disclosure may have different embodiments. In some embodiments, the at least two test blocks are formed in a peripheral area of the cell panel. In some embodiments, the at least two test blocks are formed in a blank area of the large board.

In an embodiment, the at least two test blocks are formed in the large board process and may be formed by adding mask patterns for the at least two test blocks while forming a corresponding film layer and the structures therein. In this way, it is possible to determine the shadow elimination effect of the product by performing a reflectance detection on the at least two test blocks during the large board process, in particular, after the last film layer of the product viewable area is formed (so that at least two test blocks are also formed), so as to detect and intercept the product with poor shadow elimination effect in time, rather than as in the traditional shadow elimination detection method, determining the shadow elimination effect of the product with human eyes after the small panel process is completed, resulting in unnecessary production loss.

Figure 4:
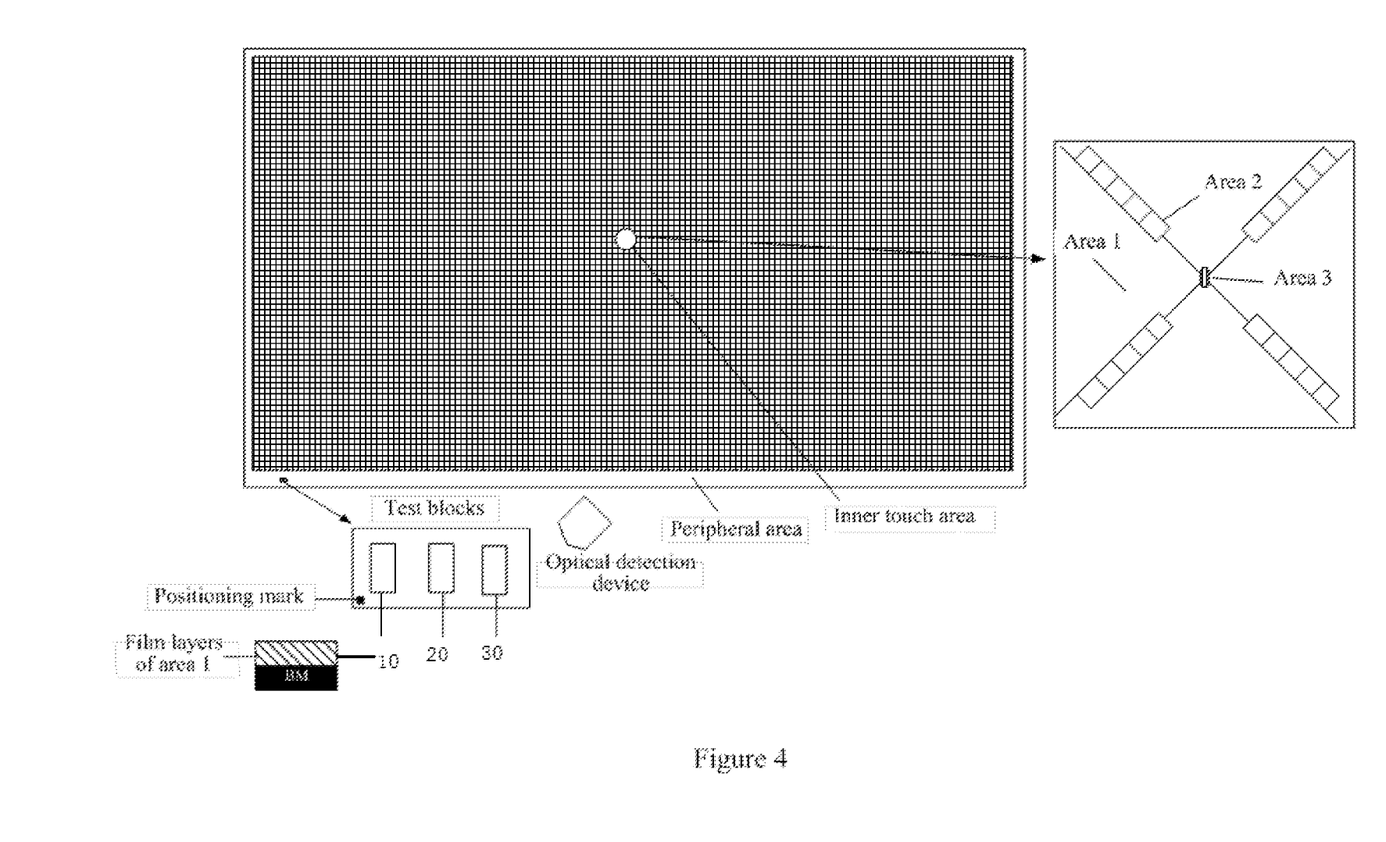
FIG. 4 shows an arrangement of at least two test blocks according to some embodiments of the present disclosure.

FIG. 4 shows an arrangement of at least two test blocks according to some embodiments of the present disclosure. As shown in FIG. 4, the at least two test blocks may be disposed in a peripheral area of a single touch substrate, and specifically on a BM layer of the peripheral area.

In some embodiments, the at least two test blocks may include a first block 10, a second block 20, and a third block 30. Therein, the first block 10 may be a laminated structure formed on the BM layer the same as or similar to the above first area 1, and may include, for example, an ITO layer and a protective layer. The second block 20 may be a laminated structure formed on the BM layer the same as or similar to the above-described second area 2, and may include, for example, only a protective layer. The third block 30 may be a laminated structure formed on the BM layer the same as or similar to the above-mentioned third area 3, and may include, for example, an insulating layer and a bridge such as a metal bridge or an ITO bridge.

In some embodiments, the at least two test blocks may also include only the first block 10 and the second block 20.

The at least two test blocks may be provided in any same or different shapes, such as a rectangle, a square, a polygon, a circle, or the like. The at least two test blocks may be provided in any size to facilitate measurement by any detection device, such as an optic inspection device, and to be conveniently accommodated in the peripheral area of the touch substrate.

In an embodiment, since the light spot of an optic inspection device generally about 1 mm, the shortest side length or diameter of the at least two test blocks is usually >=1 mm to facilitate the optic inspection.

In some embodiments, a positioning mark is further formed near the at least two test blocks to facilitate positioning the at least two test blocks by the detection device. The positioning mark, for example, may be any optical mark, for example a cross, for facilitating the positioning by the optical testing device. The positioning mark may be formed by any method capable of forming an optical pattern different from the background area. For example, the positioning mark may be formed by coating, etching or the like on the BM film layer or other film layers.

In some embodiments, the at least two test blocks are formed by adding patterns for forming the at least two test blocks on a mask for forming corresponding film layers during the manufacture of the touch substrate, and are formed simultaneously with the formation of the corresponding film layers. Thus, when the corresponding film layers are completed, the test block is formed. In this way, the test block has the same or similar film layers as the corresponding film structure area of the touch area, so that the difference in light reflectance between different laminated structure areas of the touch area can be obtained by detecting the difference in light reflectance between the at least two test blocks, in order to determine the shadow elimination level. Moreover, this way of forming the test blocks does not add extra process steps and is therefore of low cost.

For example, for the first block 10, during the formation of the ITO layer after the formation of the BM layer in the manufacturing process of the large board, a mask pattern corresponding to the size and position of the first block 10 may be added to the mask pattern for forming the ITO structure the touch area, so that the ITO layer of the first block 10 is formed at the same time as the ITO structure of the touch area is formed through steps of exposure, development, etching and the like. For the second block 20, since it corresponds to the second area 2 including the ITO etched line, that is, to the area where the ITO layer has been etched away, no special treatment may be performed during the formation of the ITO layer, the insulating layer and the bridge point, so that the laminated structure of the second block 20 will only include a protective layer on the BM layer. For the third block 30, in the process of forming the insulating layer of the third area 3 in the large board process, a mask pattern corresponding to the position and size of the third block 30 may be added to the mask pattern for forming the insulating layer of the third area 3, so that the insulating layer of the third block 30 is formed in addition to the formation of the insulating layer of the third area 3 through the steps of exposure, development, etching and the like. In addition, during the formation of the bridge points of the third area 3 in the large board process, a mask pattern corresponding to the position and the size of the third block 30 may be added to the mask pattern for forming the bridge points of the third area 3, so that, through the steps of exposure, development, etching and the like, the bridge point layer of the third block 30 is formed in addition to the formation of the bridge points of the third area 3.

After the at least two test blocks are formed in the peripheral area of the cell panel in the large board process (i.e. after the last film layer of the touch area is formed), a detection device may be used to detect the difference in light reflectance between the at least two test blocks. For this purpose, the at least two test blocks can first be positioned with the aid of the positioning mark so that the light reflectances of the at least two test blocks can be captured and detected by the detection device.

In such embodiments, since the at least two test blocks are formed on the BM layer in the peripheral area of the cell panel, and the BM layer is opaque, the detection of the light reflectances should be performed on the film side of the touch substrate (i.e., the side of the glass substrate having the film layers), and should not be performed on the glass side of the touch substrate (i.e., the side of the glass substrate opposite to the film side). Compared with the touch area of the touch substrate, the at least two test blocks has an extra BM layer. Therefore, the light reflection effect of the at least two test blocks is similar to that of the touch substrate after fully assembled with the LCD panel. Therefore, The light reflectances of the at least two test blocks may be detected to determine accurately the shadow elimination effect of the fully assembled OGS panel and the LCD panel.

After the different light reflectances of the at least two test blocks are detected, the difference in light reflectance between the at least two test blocks can be obtained by comparing the different light reflectances, so that the shadow elimination effect of the touch substrate can be determined. For example, if the absolute value of the difference in reflectance between the first block 10 and the second block 20 is greater than a threshold value a, it may be determined that the shadow elimination effect is poor; if the absolute value of the difference in reflectance between the first block 10 and the second block 20 is less than a threshold value b, it can be determined the shadow effect is good. The thresholds a and b are values that can be set according to the quality requirements of the end customer.

In addition, the shadow elimination effect may be further determined based on the difference in reflectance between the first block 10 and the third block 30. For example, if the absolute value of the difference in reflectance between the first block 10 and the second block 20 is greater than the threshold a, or the absolute value of the difference in reflectance between the first block 10 and the third block 30 is greater than a threshold c, it may be determined that the shadow elimination effect is poor. If the absolute value of the difference in reflectance between the first block 10 and the third block 20 is less than the threshold b, and the absolute value of the difference in reflectance between the first block 10 and the third block 30 is less than a threshold d, it may be determined that the shadow elimination effect is good.

In some embodiments, determining the shadow elimination effect of the touch substrate according to a difference in light reflectance between the at least two test blocks may be performed manually. In some other embodiments, determining the shadow elimination effect of the touch substrate according to a difference in light reflectance between the at least two test blocks may be performed automatically by a processing device.

In some embodiments, the at least two test blocks may be formed only in the peripheral area of one of the cell panels in the large board, and the difference in light reflectance of the at least two test blocks may be used to determine the shadow elimination level of all cell panels of the entire large board. In some other embodiments, the at least two test blocks may also be formed in the peripheral area of each of a plurality of cell panels (even all of the cell panels) in the large board, and by detecting the difference in light reflectance of the at least two tests blocks, the shadow elimination levels of all the cell panels in the entire large board, or the shadow elimination levels of the cell panels where the at least two test panels are located, may be determined.

The above steps of detecting the reflectances of at least two test blocks and comparing them to determine the shadow elimination effect of the product can be performed before the end of the large board process, so as to be able to promptly discover and intercept products with poor shadow elimination effect and avoid the costs of unnecessary subsequent production process.

Figure 5:
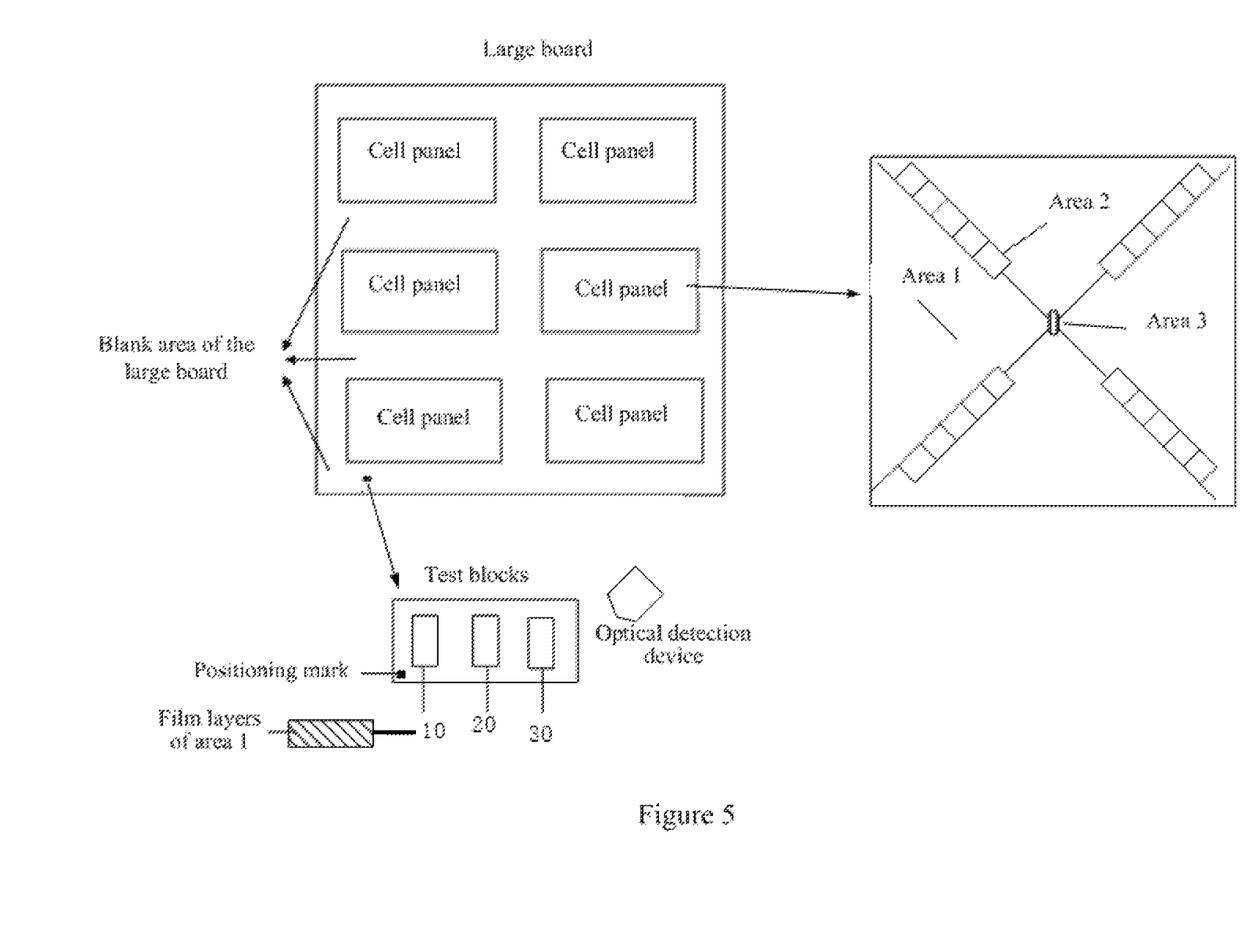
FIG. 5 shows an arrangement of at least two test blocks according to some embodiments of the present disclosure.

FIG. 5 shows an arrangement of at least two test blocks according to some embodiments of the present disclosure. As shown in FIG. 5, the at least two test blocks may be disposed in a blank area of the large board. Some embodiments are suitable for detecting the shadow elimination levels of all cell panels in the entire large board.

Since the at least two test blocks are disposed in a blank area of the large board, and there is no BM layer in a blank area of the large board, the reflectances of the at least two test blocks can be detected from either the film side or the glass side of the large board, and the detected shadow elimination effect is the same as that of the touch substrate. In addition, since the blank area of the large board is relatively large, it is suitable when the size of the peripheral area of a cell panel is insufficient to accommodate the at least two test blocks.

Apart from this, the type, shape, size, formation method and formation timing, detection method of the at least two test blocks and the method for determining the shadowing elimination effect in some embodiments are the same as or similar to those in other embodiments, thus reference may be made to the above description for more detailed understanding of some embodiments, which are not described repetitively herein.

The touch panel shadow detection method according to embodiments of the present disclosure has been described above with reference to the accompanying drawings. It should be noted that the numerous details in the foregoing description are merely examples and not intended to limit the present disclosure. In embodiments of the present disclosure, some of the above details may not be present.

In another aspect of the present disclosure, a method for manufacturing a touch substrate is provided, which includes the following steps:

In the manufacturing process of the touch substrate, test blocks with different structures are formed in an area outside a touch area of the touch substrate, and each of the test blocks with different structures includes a structure corresponding to a respective structure in different structures in the touch area.

In some embodiments, the method further includes the following step:

In the manufacturing process of the touch substrate, a positioning mark is formed in an area outside the touch area of the touch substrate, and the positioning mark is used for positioning the at least two test blocks by a detection device.

In some embodiments, the at least two test blocks are formed simultaneously with the formation of structural areas in the touch area during the manufacturing process of the touch substrate.

In some embodiments, the at least two test blocks are formed by adding mask patterns for forming the at least two test blocks on masks for forming corresponding film layers of the structure area in the touch area.

In some embodiments, the manufacturing process of the touch substrate includes a large board process, in which a plurality of cell panels are formed on a large board, and a small panel process, in which the large board is cut into a plurality of cell panels, and the at least two test blocks are formed in a blank area of the large board in the large board process.

In some embodiments, the manufacturing process of the touch substrate includes a large board process, in which a plurality of cell panels are formed on a large board, and a small panel process, in which the large board is cut into a plurality of cell panels, and the at least two test blocks are formed on a black matrix layer in a periphery of a cell panel in the large board process.

As will be appreciated by those skilled in the art, more details on the manufacturing method of the touch substrate can be obtained from the above description of the touch panel shadow elimination detection method of the present disclosure and conventional knowledge in the art, and therefore will not be described repetitively herein.

Still another aspect of the present disclosure provides a touch substrate, including test blocks with different structures located in an area outside a touch area thereof, wherein each of the test blocks with different structures includes a structure corresponding to a respective structure in different structures in the touch area.

In some embodiments, the test blocks include a first test block corresponding to a conductive block in the touch area, and a second test block corresponding to an etched line in the touch area.

In some further embodiments, the test blocks further include a third test block corresponding to a bridge point area in the touch area.

In some embodiments, the test blocks are rectangular or square with a shortest side length of greater than or equal to 1 millimeter.

In some embodiments, the touch substrate further includes a positioning mark for positioning the test blocks by a detection device.

As will be appreciated by those skilled in the art, more details about the touch substrate can be obtained from the above description of the shadow elimination detection method for a touch substrate of the present disclosure and conventional knowledge in the art, and thus will not be described repetitively herein.

Still another aspect of the present disclosure further provides a touch device, which includes the touch substrate according to any embodiment of the present disclosure. As known to those skilled in the art, the touch device may further include other components, such as an LCD panel, a control board, a backlight module, and the like. Since these other components may be prior art components, details thereof are not described repetitively herein.

It can be understood that the above embodiments of the present disclosure are merely exemplary embodiments used for illustrating the principle of the present disclosure, and the disclosure is not limited thereto. For those skilled in the art, various modifications and improvements may be made without departing from the spirit and essence of the present disclosure, and these variations and improvements are also deemed to be within the protection scope of the present disclosure. The scope of the present disclosure is defined only by the meaning of the language expressions of the appended claims and their equivalents.

What is claimed is:

1. A shadow elimination detection method for a touch substrate, the method comprising:

detecting a difference in light reflectance between test blocks with different structures located in an area outside a touch area of the touch substrate using a detection device; and determining a shadow elimination effect of the touch substrate based on the difference, wherein each of the test blocks with different structures includes a structure corresponding to a respective structure in the touch area, and wherein the test blocks comprise a first test block corresponding to a conductive block in the touch area, a second test block corresponding to an etched line in the touch area, and a third test block corresponding to a bridge point area in the touch area.

2. The method according to claim 1, wherein the test blocks are rectangular or square with a shortest side length being greater than or equal to 1 millimeter.

3. The method according to claim 1, further comprising:
locating, using the detection device, the test blocks based on a positioning mark located in an area outside the touch area of the touch substrate.

4. The method according to claim 1, wherein the test blocks are formed simultaneously with the formation of a structural area in the touch area during the manufacture of the touch substrate.

5. The method according to claim 4, wherein the test blocks are formed by adding patterns for forming the test blocks on masks for forming film layers of the structural area in the touch area.

6. The method according to claim 1, wherein the detection device comprises at least one of an optic inspection device, a sensor, and a digital image processing device.

7. The method according to claim 1, wherein a manufacturing process of the touch substrate comprises a large board process, in which a plurality of cell panels are formed on the large board, and a small panel process, in which the large board is cut into the plurality of cell panels, and wherein the test blocks are formed in a blank area of the large board during the large board process.

8. The method according to claim 1, wherein the manufacturing process of the touch substrate comprises a large board process, in which a plurality of cell panels are formed on the large board, and a small panel process, in which the large board is cut into the plurality of cell panels, and wherein the test blocks are formed on a black matrix layer in a periphery of a cell panel in the large board process.

9. A method for manufacturing a touch substrate, the method comprising:
forming test blocks with different structures in an area outside a touch area of the touch substrate in a manufacturing process of the touch substrate, wherein each of the test blocks with different structures includes a structure corresponding to a respective structure in the touch area, and wherein the test blocks include a first test block corresponding to a conductive block in the touch area, a second test block corresponding to an etched line in the touch area, and a third test block corresponding to a bridge point area in the touch area.

10. The method according to claim 9, wherein the manufacturing process of the touch substrate comprises a large board process, in which a plurality of cell panels are formed on a large board, and a small panel process, in which the large board is cut into the plurality of cell panels, wherein the test blocks are formed in a blank area of the large board in the large board process.

11. The method according to claim 9, wherein the manufacturing process of the touch substrate comprises a large board process, in which a plurality of cell panels are formed on a large board, and a small panel process, in which the large board is cut into the plurality of cell panels, wherein the test blocks are formed on a black matrix layer in a periphery of a cell panel in the large board process.

12. A touch substrate comprising:
test blocks with different structures located in an area outside a touch area thereof, wherein each of the test blocks with different structure includes a structure corresponding to a respective structure in the touch area, and wherein the test blocks comprise a first test block corresponding to a conductive block in the touch area, a second test block corresponding to an etched line in the touch area, and a third test block corresponding to a bridge point area in the touch area.

13. The touch substrate according to claim 12, wherein the test blocks are rectangular or square, and the shortest side length thereof is greater than or equal to 1 millimeter.

14. The touch substrate according to claim 12, further comprising:
a positioning mark for positioning the test blocks by a detection device.

15. A touch device comprising the touch substrate according to claim 12.

16. The touch device according to claim 15, wherein the test blocks are rectangular or square, and wherein the shortest side length thereof is greater than or equal to 1 millimeter.

17. The touch device according to claim 15, wherein the touch substrate further comprises a positioning mark for positioning the test blocks by a detection device.

* * * * *